Figure 1:
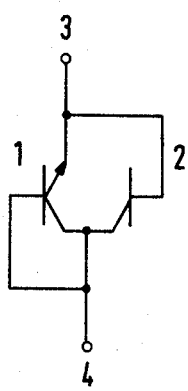

United States Patent [19]

Schulz et al.

[11] 4,249,192

[45] Feb. 3, 1981

[54] MONOLITHIC INTEGRATED SEMICONDUCTOR DIODE ARRANGEMENT

[75] Inventors: Egon Schulz, Emmendingen; Ulrich Dolega, Freiburg, both of Fed. Rep. of Germany

[73] Assignee: ITT Industries, Inc., New York, N.Y.

[21] Appl. No.: 899,914

[22] Filed: Apr. 26, 1978

[30] Foreign Application Priority Data

Apr. 27, 1977 [DE] Fed. Rep. of Germany ....... 2718644

[51] Int. Cl.³ .......................................... H01L 29/00
[52] U.S. Cl. ..................................... 357/38; 357/20; 357/39; 357/52; 357/86
[58] Field of Search ...................... 357/86, 37, 39, 52, 357/20

[56] References Cited

U.S. PATENT DOCUMENTS

| 3,878,551 | 4/1975 | Callahan | 357/86 |
| 4,017,882 | 4/1977 | Kannam et al. | 357/37 |

*Primary Examiner*—Joseph E. Clawson, Jr.
*Attorney, Agent, or Firm*—John T. O'Halloran; Peter C. Van Der Sluys

[57] ABSTRACT

A semiconductor diode for use in a double plug glass housing is formed in a planar arrangement having two transistor structures, one of which is diode-connected by connecting the base to the collector, and the other of which has no emitter region. Both transistors being connected in parallel with a common collector region and one transistor structure surrounds the other.

1 Claim, 2 Drawing Figures

MONOLITHIC INTEGRATED SEMICONDUCTOR DIODE ARRANGEMENT

The present invention relates to a monolithic integrated semiconductor diode arrangement corresponding to the preamble of claim 1. In starting out from the five well-known possibilities of realizing diode functions in monolithic integrated circuits, cf. for example, German technical journal "Regelungstechnische Praxis und Prozeß-Rechentechnik," 1970, No. 6, page M46, FIGS. 2 and 3, the invention is based on the problem of providing a favourable selection for the monolithic integration, from among the basically possible ten antiparallel arrangements of each time two such diode functions. According to the invention, this problem is solved by taking the measures set forth in the characterizing clause of claim 1.

It is achieved in an advantageous manner by the chosen embodiment, that there are no longer required the so-called insulating islands, i.e., the two transistor structures can be designed to have a region common to both collectors. Moreover it becomes possible by this to build the semiconductor diode arrangement according to the invention into housings, especially glass housings which are customarily used for ordinary diodes. Finally, the dimensions of the individual semiconductor regions and the process parameters relating to the manufacture thereof, can be optimized in a simple way so that, if so required, it will be possible to achieve a very exact symmetry of the current-voltage characteristic in both current directions.

Advantageous further embodiments of the invention are characterized in the subclaims.

Figure 2:
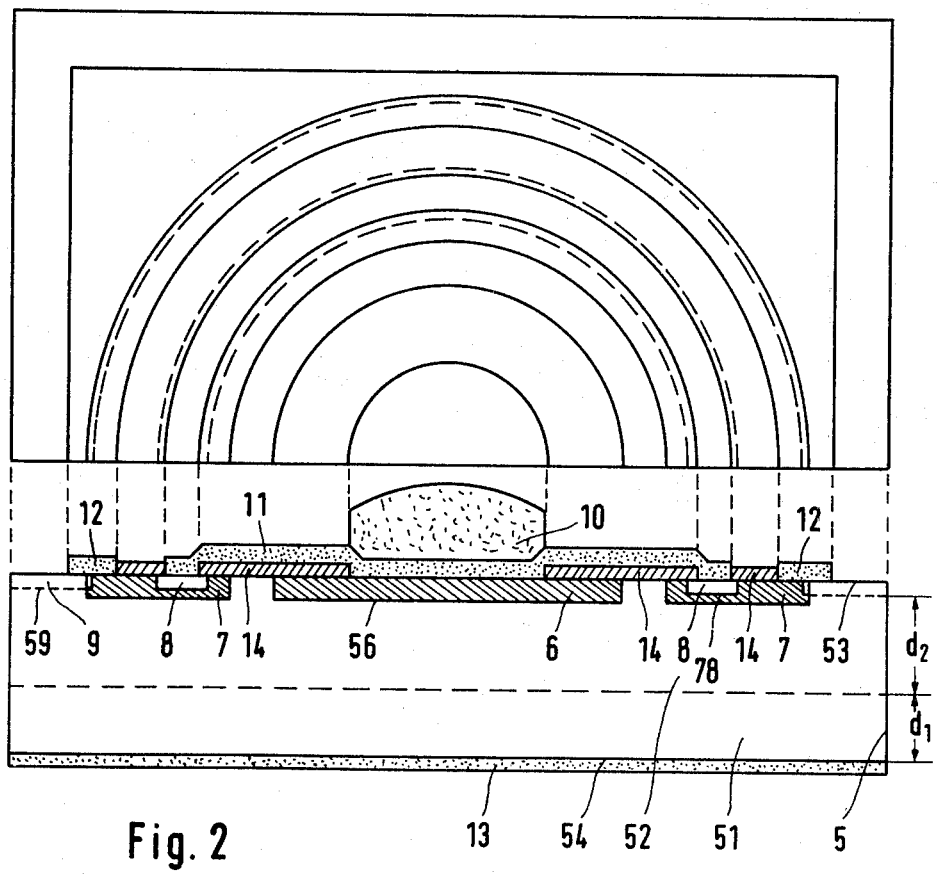

The invention will now be explained in greater detail with reference to FIGS. 1 and 2 of the accompanying drawings, in which:

FIG. 1 shows the circuit diagram of the semiconductor diode arrangement according to the invention, and FIG. 2 shows both the plan view and the cross-sectional view of the semiconductor wafer of an example of embodiment according to the invention.

In FIG. 1, as the first of three current branches connected in parallel, the emitter-base junction of the first transistor structure 1 is connected in parallel as a second current branch to the emitter-collector path of the first transistor structure 1 as lying between the first outer terminal 3 and the second outer terminal 4, and the base-collector junction of the second transistor structure 2 is connected in parallel as a third current branch. Accordingly, if a potential is applied to the first outer terminal 3 which is more positive than that applied to the second outer terminal 4, the current will flow through the base-collector diode of the second transistor structure 2 which is then operated in the forward direction. However, if to the first outer terminal 3 there is applied a potential which is more negative compared to that applied to the second outer terminal 4, the major portion of the current will flow via the base-emitter junction of the first transistor structure 1 and a, compared to this, negligible portion will flow via the collector-emitter path of this transistor structure.

It should be emphasized that the second transistor structure 2 has no emitter region so that this structure, when looked at from a purely schematically-formal point of view, is actually no transistor structure at all. It is well justified, of course, to refer to this structure as a transistor structure, because the one region thereof, as already mentioned, is a region common to the collector region of the first transistor structure, and because the other region thereof is manufactured in the course of the processing step resulting in the base region of the first transistor structure 1, and is thus a "base region".

FIG. 2 shows both the plan view and the cross-sectional view of an example of embodiment of the invention suitable for being built easily into one of the aforementioned glass housings. In this case the semiconductor wafer 5 consists on its rearside 54 of the low-ohmic substrate 51 normally of the n+-conductivity type, and on its front side 53 of a higher ohmic layer 52 of the same conductivity type, hence of the n-conductivity type, epitaxially grown thereon. It is possible without further ado, to desist from this subdivision as regards the conductivity of the semiconductor wafer 5 between the front and the rearside, and to select for the semiconductor wafer 5 a monocrystalline silicon wafer of continuously the same conductivity type and the same specific resistance.

The first region 6 of the second conductivity type is arranged in the centre on the front side 53 of the semiconductor wafer 5. Hence, in the case of a n-conducting semiconductor wafer 5, this consists of a p-conducting region 6. In manufacturing monolithic integrated circuits, this region is produced in accordance with the planar process in the usual way by diffusion or ion implantation.

The first region 6 is surrounded at a sufficient spacing by the second region 7 of the second conductivity type in a ring-shaped manner, with this second region capable of being manufactured together with the first region 6 in the course of the same diffusion or implantation process. In manufacturing these regions there is employed the usual silicon dioxide or silicon nitride masking technique, of which mask in FiG. 2 there can still be recognized the masking portions 14 covering the pn-junctions extending to the surface of the front side 53.

The first ring-shaped region 8 of the first conductivity type is completely embedded in the second region 7. Moreover, the second ring-shaped region 9 is embedded in such a way in the second region 7 that it is partly embedded in the second region 7, and is positioned with its remaining portion on the front side 53 of the semiconductor wafer 5 and, consequently, in the epitaxially grown layer 52. The two ring-shaped regions 8, 9 are produced by a diffusion or implantation, so that these regions, in the case of the aforementioned types of conductivities, are of the n+-conductivity type.

The first region 6 and the first ring-shaped region 8 are in electrical contact with one another via the first metal coating 11 extending over the corresponding mask portions 14, with the raised contact 10 being arranged in the centre of this metal coating, and normally produced by way of galvanic deposition as a so-called mushroom contact. By the second metal coating 12 both the second region 7 and the second ring-shaped region 9 are electrical connected with one another. Finally, the continuous third metal coating 13 is arranged on the rearside 54 of the semiconductor wafer 5.

Accordingly, if to the raised contact 10 corresponding to the outer terminal 3 of FIG. 1, there is applied a potential which is more positive with respect to the third metal coating 13 corresponding to the outer terminal 4 of FIG. 1, then the current will flow from the contact 10 via the metal coating 11, the first region 6, the pn-junction 56 as operated in the forward direction, the epitaxial layer 52 and the low-ohmic substrate 51 to the metal coating 13.

However, if the contact 10 is negatively biased with respect to the metal coating 13, then the main current will flow from the metal coating 13 via the low-ohmic substrate 51, the epitaxial layer 52, the junction 59, the second ring-shaped region 9, the metal coating 12, the second region 7, the second ring-shaped region 8 and the metal coating 11 to the contact 10 while the aforementioned negligible current will flow from the metal coating 13 via the low-ohmic substrate 51, the epitaxial layer 52 the second region 7, the first ring-shaped region 8 and the metal coating 11 to the contact 10.

On condition that the product of the current amplification factor in a common-base operation and of the corresponding current amplification factor in an inverse operation of the first transistor structure 1 is small with respect to unity, there will result an optimum symmetry of the semiconductor diode arrangement according to the invention in the case of small currents when the following relationship exists:

$$A_{78} \cdot N_{56} \cdot L_{56} = A_{56} \cdot N_{78} \cdot L_{78}$$

wherein the quantities $A_{56}$, $A_{78}$ refer to the surfaces of the pn-junctions 56, 78 while the quantities $N_{56}$, $N_{78}$ refer to the impurity concentration on the higher ohmic side of the respective pn-junction 56, 78, and the quantities $L_{56}$, $L_{78}$ refer to the diffusion length of the minority charge carriers on the higher ohmic side of the respective pn-junction 56, 78.

There will be obtained an optimal symmetry of the current-voltage characteristic in the case of high currents, when the following condition is satisfied:

$$r_1 = (\rho_1 \cdot d_1 + \rho_2 \cdot d_2)(1/A_{56} - 1/A_{59})$$

where $\rho_1$, $\rho_2$ are the resistivity of the low-ohmic substrate 51 or of the epitaxial layer 52, where $d_1$, $d_2$ indicate the thickness of this respective layer, and where $A_{59}$ is the surface of the junction 59 between the epitaxial layer 52 and the second ring-shaped region 9.

Thus, a semiconductor diode arrangement which is optimum with respect to the symmetry of the current-voltage characteristic can be established in the known manner by selecting the surfaces $A_{56}$, $A_{59}$, $A_{78}$, the semiconductor wafer parameters (resistivity $\rho$, thickness d) and the quantities depending on the diffusion.

The semiconductor diode arrangement according to the invention is preferably built into a glass housing of the type 54 A 2 according to German Industrial Standards (DIN) 41 880, i.e. into the so-called double-plug housing, in which the semiconductor wafer is pressure-contacted between the ends of the inner-conductors designed as contact plugs. Such a semiconductor diode arrangement provided with a housing can be used without further ado and in an advantageous manner for replacing the hitherto conventional acoustic-shock absorbing rectifiers.

What is claimed is:
1. A semiconductor diode arrangement, comprising:
a semiconductor wafer of the first conductivity type having first and second surfaces, including a layer of low ohmic substrate adjacent said second surface and a layer of higher ohmic substrate of the same conductivity type epitaxially grown on said layer of low ohmic substrate and adjacent the first surface;
a first region of the second conductivity type formed in the center of the first surface of the semiconductor wafer;
a second region of the second conductivity type formed in the first surface of the semiconductor body and surrounding the first region in spaced relation;
a third region of the first conductivity type formed in the second region;
a fourth region of the first conductivity type formed in the first surface of the semiconductor body and being partially embedded in the second region and spaced from the third region, said regions being formed and arranged so that the following relationship exists:

$$A_2 \cdot N_1 \cdot L_1 \approx A_1 \cdot N_2 \cdot L_2$$

wherein $A_1$ corresponds to the surface area of a junction formed between the first region and the semiconductor wafer, $A_2$ corresponds to the surface area of a junction formed between the third region and the second region, $N_1$ corresponds to the impurity concentration on the higher ohmic side of the junction formed between the first region and the semiconductor wafer, $N_2$ corresponds to the impurity concentration on the higher ohmic side of the junction formed between the third region and the second region, $L_1$ corresponds to the diffusion length of the minority charge carriers on the higher ohmic side of the junction formed between the first region and the semiconductor wafer and $L_2$ corresponds to the diffusion length of the minority charge carriers on the higher ohmic side of the junction formed between the third region and the second region;
a first metal coating connecting said first region and said third region;
a second metal coating connecting the second region and the fourth region;
first contact means disposed on said first metal coating; and
second contact means formed on said second surface of said semiconductor wafer.

* * * * *